United States Patent
Korevaar et al.

(10) Patent No.: US 10,141,463 B2
(45) Date of Patent: Nov. 27, 2018

(54) PHOTOVOLTAIC DEVICES AND METHODS FOR MAKING THE SAME

(71) Applicant: First Solar Malaysia Sdn. Bhd., Kulim (MY)

(72) Inventors: Bastiaan Arie Korevaar, Schenectady, NY (US); Qunjian Huang, Schenectady, NY (US); Yiteng Jin, Schenectady, NY (US); Qianqian Xin, Schenectady, NY (US)

(73) Assignee: First Solar Malaysia SDN. BHD., Kulim (MY)

( * ) Notice: Subject to any disclaimer, the term of this patent is extended or adjusted under 35 U.S.C. 154(b) by 0 days.

(21) Appl. No.: 14/892,349

(22) PCT Filed: Jun. 6, 2014

(86) PCT No.: PCT/US2014/041256
§ 371 (c)(1),
(2) Date: Nov. 19, 2015

(87) PCT Pub. No.: WO2014/190362
PCT Pub. Date: Nov. 27, 2014

(65) Prior Publication Data
US 2016/0126378 A1    May 5, 2016

(30) Foreign Application Priority Data
May 21, 2013 (CN) .......................... 2013 1 0190090

(51) Int. Cl.
*H01L 31/0336* (2006.01)
*H01L 31/0224* (2006.01)
(Continued)

(52) U.S. Cl.
CPC .... *H01L 31/0336* (2013.01); *H01L 31/02963* (2013.01); *H01L 31/022441* (2013.01);
(Continued)

(58) Field of Classification Search
CPC ......... H01L 31/0336; H01L 31/022466; H01L 31/022441; H01L 31/1828
(Continued)

(56) References Cited

U.S. PATENT DOCUMENTS 3,496,024 A   2/1970 Ruehrwein
3,565,686 A   2/1971 Babcock et al.
(Continued)

FOREIGN PATENT DOCUMENTS

AU   2012200546 A1   8/2012
CN   102206801 A   10/2011
(Continued)

OTHER PUBLICATIONS

Chinese First Office Action, Application No. CN 201310190090.0, dated Dec. 4, 2015.
(Continued)

*Primary Examiner* — Tae-Sik Kang
(74) *Attorney, Agent, or Firm* — MacMillan, Sobanski & Todd, LLC

(57) ABSTRACT

A photovoltaic device includes a support layer; a first layer comprising cadmium, tellurium and copper and being of n-type; a second layer comprising cadmium, tellurium and copper and being of p-type; and a transparent conductive oxide layer. A method for making a photovoltaic device includes providing a stack comprising a cadmium and tellurium comprising layer and a copper comprising layer on the cadmium and tellurium comprising layer; and thermally annealing the stack to form a first layer and a second layer each comprising cadmium, tellurium and copper, the first layer being of n-type, the second layer being of p-type.

12 Claims, 3 Drawing Sheets

(51) Int. Cl.
*H01L 31/18* (2006.01)
*H01L 31/0296* (2006.01)
*H01L 31/0392* (2006.01)
*H01L 31/068* (2012.01)

(52) U.S. Cl.
CPC ............. *H01L 31/022466* (2013.01); *H01L 31/03925* (2013.01); *H01L 31/068* (2013.01); *H01L 31/1828* (2013.01); *H01L 31/1864* (2013.01); *H01L 31/1884* (2013.01); *Y02E 10/547* (2013.01)

(58) Field of Classification Search
USPC .................................................. 136/256, 260
See application file for complete search history.

(56) References Cited

U.S. PATENT DOCUMENTS

| | | | |
|---|---|---|---|
| 4,231,808 A | 11/1980 | Tabei et al. | |
| 4,368,216 A | 1/1983 | Manassen et al. | |
| 4,382,118 A | 5/1983 | Oka | |
| 4,388,483 A | 6/1983 | Basol et al. | |
| 4,568,792 A | 2/1986 | Mooney et al. | |
| 4,614,891 A | 9/1986 | Kuwahata et al. | |
| 4,682,212 A | 7/1987 | Inuiya et al. | |
| 5,578,502 A | 11/1996 | Albright et al. | |
| 5,909,632 A | 6/1999 | Gessert | |
| 6,379,767 B1 | 4/2002 | Park et al. | |
| 6,488,770 B1 | 12/2002 | Meissner et al. | |
| 6,537,845 B1 | 3/2003 | McCandless et al. | |
| 7,812,249 B2 | 10/2010 | King et al. | |
| 7,985,919 B1 | 7/2011 | Roscheisen et al. | |
| 8,084,682 B2 | 12/2011 | Chen | |
| 8,198,117 B2 | 6/2012 | Leidholm et al. | |
| 8,309,387 B2 | 11/2012 | Forehand | |
| 8,390,122 B2 | 3/2013 | Feldman-Peabody | |
| 8,426,722 B2 | 4/2013 | Munteanu et al. | |
| 8,653,616 B2 | 2/2014 | Kamada et al. | |
| 9,276,154 B2 | 3/2016 | Damjanovic et al. | |
| 2003/0070707 A1 | 4/2003 | King et al. | |
| 2004/0063320 A1 | 4/2004 | Hollards | |
| 2004/0261841 A1 | 12/2004 | Negami et al. | |
| 2005/0041571 A1 | 2/2005 | Ichihara et al. | |
| 2006/0213550 A1 | 9/2006 | Yamazaki et al. | |
| 2007/0000537 A1 | 1/2007 | Leidholm et al. | |
| 2007/0295390 A1 | 12/2007 | Sheats et al. | |
| 2008/0092945 A1 | 4/2008 | Munteanu et al. | |
| 2008/0110498 A1 | 5/2008 | Zafar et al. | |
| 2008/0152868 A1 | 6/2008 | Sato et al. | |
| 2008/0156365 A1 | 7/2008 | Scholz et al. | |
| 2008/0223430 A1 | 9/2008 | Krasnov et al. | |
| 2008/0251119 A1 | 10/2008 | Forehand | |
| 2009/0020149 A1 | 1/2009 | Woods et al. | |
| 2009/0025640 A1 | 1/2009 | Sager et al. | |
| 2009/0235986 A1 | 9/2009 | Hotz et al. | |
| 2009/0242029 A1 | 10/2009 | Paulson et al. | |
| 2009/0261438 A1 | 10/2009 | Choi et al. | |
| 2010/0180935 A1 | 7/2010 | Chen | |
| 2010/0186815 A1 | 7/2010 | Yang et al. | |
| 2010/0186816 A1 | 7/2010 | Park et al. | |
| 2010/0206381 A1 | 8/2010 | Aida et al. | |
| 2010/0236607 A1 | 9/2010 | Korevaar et al. | |
| 2010/0326489 A1 | 12/2010 | Ahn | |
| 2011/0011983 A1 | 1/2011 | King et al. | |
| 2011/0024876 A1 | 2/2011 | Bower et al. | |
| 2011/0081743 A1 | 4/2011 | Kawano | |
| 2011/0139227 A1 | 6/2011 | Sivananthan et al. | |
| 2011/0139235 A1 | 6/2011 | Gossman et al. | |
| 2011/0139240 A1 | 6/2011 | Allenic et al. | |
| 2011/0220191 A1 | 9/2011 | Flood | |
| 2011/0247687 A1 | 10/2011 | Zhang et al. | |
| 2011/0265865 A1 | 11/2011 | Korevaar | |
| 2011/0272744 A1 | 11/2011 | Ning et al. | |
| 2011/0277838 A1 | 11/2011 | Ma et al. | |
| 2011/0284065 A1* | 11/2011 | Basol | H01L 29/45 136/256 |
| 2011/0290308 A1 | 12/2011 | Korevaar | |
| 2011/0318941 A1 | 12/2011 | Schmidt et al. | |
| 2012/0017977 A1 | 1/2012 | Satou et al. | |
| 2012/0024380 A1* | 2/2012 | Feldman-Peabody | C23C 14/0057 136/260 |
| 2012/0067392 A1 | 3/2012 | Gloeckler | |
| 2012/0090661 A1 | 4/2012 | Capps et al. | |
| 2012/0132256 A1 | 5/2012 | Sager | |
| 2012/0132268 A1 | 5/2012 | Rojo et al. | |
| 2012/0138129 A1 | 6/2012 | Kim et al. | |
| 2012/0156828 A1 | 6/2012 | Peng et al. | |
| 2012/0180844 A1 | 7/2012 | Ward, III | |
| 2012/0192923 A1 | 8/2012 | Korevaar et al. | |
| 2012/0192930 A1 | 8/2012 | Fox et al. | |
| 2012/0313200 A1 | 12/2012 | Jackrel et al. | |
| 2013/0000726 A1 | 1/2013 | Skarp | |
| 2013/0019934 A1* | 1/2013 | Gossman | H01L 31/1884 136/256 |
| 2013/0037100 A1 | 2/2013 | Platzer Bjorkman et al. | |
| 2013/0068279 A1 | 3/2013 | Buller et al. | |
| 2013/0074912 A1 | 3/2013 | Walukiewicz et al. | |
| 2013/0081670 A1 | 4/2013 | Ashley et al. | |
| 2013/0104985 A1 | 5/2013 | Korevaar et al. | |
| 2013/0109124 A1 | 5/2013 | Peng et al. | |
| 2013/0280854 A1 | 10/2013 | Jasieniak et al. | |
| 2014/0216542 A1 | 8/2014 | Shao et al. | |
| 2014/0216550 A1 | 8/2014 | Damjanovic et al. | |
| 2014/0273334 A1 | 9/2014 | Christensen et al. | |
| 2014/0373908 A1 | 12/2014 | Duggal et al. | |
| 2015/0214403 A1 | 7/2015 | Wu et al. | |
| 2016/0126396 A1 | 5/2016 | Damjanovic et al. | |

FOREIGN PATENT DOCUMENTS

| | | |
|---|---|---|
| EP | 0248953 A1 | 12/1987 |
| EP | 0300799 A2 | 1/1989 |
| EP | 2381482 A1 | 10/2011 |
| EP | 2954562 A2 | 12/2015 |
| WO | 2008136872 A2 | 11/2008 |
| WO | 2010031010 A1 | 3/2010 |
| WO | 2010110467 A1 | 9/2010 |
| WO | 2011036458 A2 | 3/2011 |
| WO | 2012045113 A1 | 4/2012 |
| WO | 2014123806 A2 | 8/2014 |
| WO | 2014151610 A1 | 9/2014 |
| WO | 2014179652 A1 | 11/2014 |

OTHER PUBLICATIONS

Wang, "Homojunction and Heterojunction in Cdte Polycrystalline Thin Films", Electro-Optic Technology Application, 2009, vol. 24, No. 2, pp. 44-46.

Cusano, et al. "CdTe Solar Cells and Photovoltaic Hetero-Junctions in II-VI Compounds", Solid-State Electronics, Pergamon Press 1963, vol. 6, No. 3, pp. 217-232.

Emziane, et al. "The Distribution of Impurities in the Interfaces and Window Layers of Thin-Film Solar Cells", Journal Of Applied Physics, vol. 97, No. 11, 2005, pp. 114910-1-114910-6.

European Patent Office Search Report, Application No. 14800780.0, dated Nov. 21, 2016.

Godines, et al. "Comparative Secondary Ion Mass Spectroscopy Analysis of Solar Cell Structures Grown by Pulsed Laser Ablation and Ion Sputtering", Semiconductor Science and Technology, vol. 19, No. 2, 2004, pp. 213-218.

Romeo, et al. "Development of Thin-Film Cu(In,Ga)Se2 and CdTe Solar Cells", Progress in Photovoltaics Research and Applications, vol. 12, No. 23, 2004, pp. 93-111.

Romeo, et al. "Recent Progress on CdTe/CdS Thin Film Solar Cells", Solar Energy 77, No. 6, 2004, pp. 795-801.

Yun, et al. Back Contact Formation Using Cu2Te as a Cu-Doping Source and as an Electrode in CdTe Solar Cells, Solar Energy Materials & Solar Cells, vol. 75, 2003, pp. 203-210.

(56) References Cited

OTHER PUBLICATIONS

Burgelman et al. "Modelling polycrystalline semiconductor solar cells", Thin Solid Films, 2000, vol. 361-362, pp. 527-532.

Chanda, "Copper doped window layer for CdSe colar cells", Graduate School Theses and Dissertations, University of South Florida, 2008, pp. 1-74.

Duenow et al., "CdS/CdTe Solar Cells Containing Directly Deposited CdSxTe1-x Alloy Layers", Presented that the 37th IEEE Photovoltaic Specialists Conference, Seattle, Washington, Jun. 19-24, 2011, pp. 1-8.

Gloeckler et al., "Numerical Modeling of Cigs and CdTe Solar Cells: Setting the Baseline", Photovoltaic Energy conversion, 2003, Proceedings of the 3rd World Conference, May 11-18, 2003, pp. 1-6.

Gur et al., "Air-Stable All-Inorganic Nanocrystal Solar Cells Processed from Solution", Science, 2005, vol. 310, pp. 462-465.

MacDonald et al., "Layer-by-Layer Assembly of Sintered CdSexTe1-x Nanocrystal Solar Cells", American Chemical Society NANO, 2012, vol. 6, No. 7, pp. 5995-6004.

McCandless et al., "Cadmium Telluride Solar Cells", Handbook of Photovoltaic Science and Engineering, 2003, pp. 617-662.

Murali et al., "Electrical Properties of Sintered CdSxSe1-x Films", Chalcogenide Letters, 2008, vol. 5, No. 9, pp. 181-186.

Noori, "Optical Characteristics of CdSSe Films Prepared by Thermal Evaporation Technique", Baghdad Science Journal, 2011, vol. 8, No. 1, pp. 155-160.

Oladeji et al., "Metal/CdTe/CdS/Cd1-xZnxS/TCO/glass: A new CdTe thin film solar cell structure", Solar Energy Materials & Solar Cells, 2000, vol. 61, pp. 203-211.

Tanaka et al., "Zinc and Selenium Co-doped CdTe Substrates Lattice Matched to HgCdTe", Journal of Crystal Growth, 1989, vol. 94, pp. 166-170.

Toyama et al., "Doping effects of dimethyl-tin-dichloride on material properties of CdS films and on formation of CdS/CdTe heterostructures", Journal off Applied Physics, 2005, vol. 98, pp. 1-6.

Chinese First Office Action, Application No. CN201480045027.0, dated Nov. 4, 2016.

Chinese First Office Action, Application No. CN201480037816.X, dated Aug. 4, 2017.

Chinese Second Office Action, Application No. CN201480037816.X, dated Jan. 17, 2018.

Chilean First Office Action, Application No. CL201503219, dated Oct. 16, 2017.

Chilean Second Office Action, Application No. CL201503219, dated Mar. 14, 2018.

Extended European Search Report, Application No. EP14791065.7, dated Nov. 17, 2016.

Extended European Search Report, Application No. EP14807775.3, dated Jan. 5, 2017.

European Examination Report, Application No. EP14791065.7, dated Jan. 22, 2018.

PCT International Search Report and the Written Opinion, Application No. PCT/US2014/014414, dated Jul. 30, 2014.

PCT International Search Report and the Written Opinion, Application No. PCT/US2014/036501, dated Sep. 5, 2014.

PCT International Search Report and the Written Opinion, Application No. PCT/US2014/036503, dated Sep. 5, 2014.

PCT International Search Report and the Written Opinion, Application No. PCT/US2015/015387, dated Jun. 23, 2015.

* cited by examiner

PHOTOVOLTAIC DEVICES AND METHODS FOR MAKING THE SAME

BACKGROUND

The invention generally relates to photovoltaic devices and methods for making the photovoltaic devices. More particularly, the invention relates to photovoltaic devices including cadmium and tellurium and methods for making them.

Photovoltaic devices, such as thin film solar cells, typically comprise cadmium telluride (CdTe) layers and cadmium sulfide (CdS) layers. An intermixed region at the CdTe—CdS interface may negatively affect the performance of the photovoltaic device.

Thus, there is a need for improved photovoltaic devices, and methods for making them.

BRIEF DESCRIPTION OF THE INVENTION

Embodiments of the present invention are included to meet these and other needs. One embodiment is a photovoltaic device. The photovoltaic device includes a support layer; a first layer comprising cadmium, tellurium and copper and being of n-type; a second layer comprising cadmium, tellurium and copper and being of p-type; and a transparent conductive oxide layer.

One embodiment is a method for making a photovoltaic device. The method includes providing a stack comprising a cadmium and tellurium comprising layer and a copper comprising layer on the cadmium and tellurium comprising layer; and thermally annealing the stack to form a first layer and a second layer each comprising cadmium, tellurium and copper, the first layer being of n-type, the second layer being of p-type.

DRAWINGS

These and other features, aspects, and advantages of the present invention will become better understood when the following detailed description is read with reference to the accompanying drawings, wherein.

DETAILED DESCRIPTION

Figure 1:
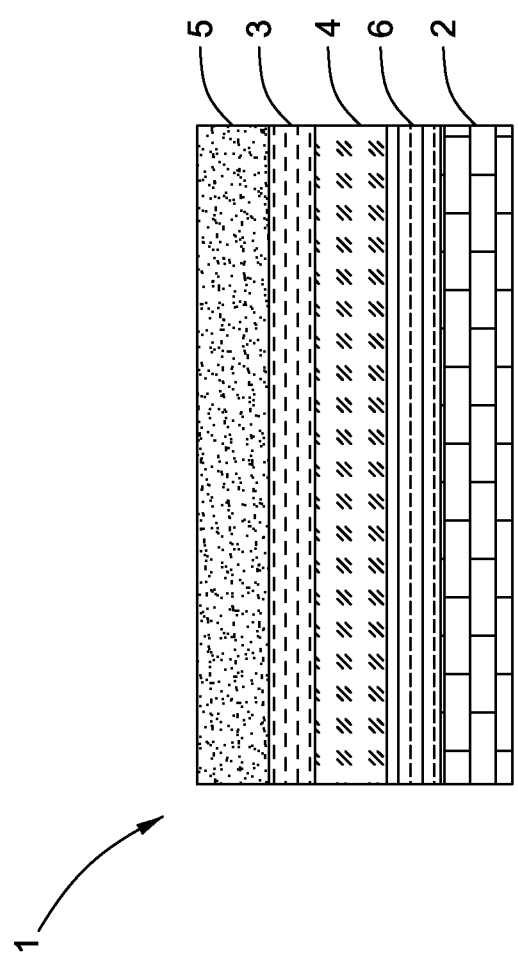
FIG. 1 is a schematic cross-sectional view of a photovoltaic device according to a first embodiment of the invention.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. The use of "including", "comprising" or "having" and variations thereof herein are meant to encompass the items listed thereafter and equivalents thereof as well as additional items.

Approximating language, as used herein throughout the specification and claims, may be applied to modify any quantitative representation that could permissibly vary without resulting in a change in the basic function to which it is related. Accordingly, a value modified by a term or terms, such as "about" and "substantially" is not to be limited to the precise value specified. In some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

In the specification and the claims, the singular forms "a", "an" and "the" include plural referents unless the context clearly dictates otherwise. As used herein, the term "or" is not meant to be exclusive and refers to at least one of the referenced components (for example, a layer) being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable. For example, in some circumstances, an event or capacity can be expected, while in other circumstances, the event or capacity cannot occur. This distinction is captured by the terms "may" and "may be".

Reference throughout the specification to "one embodiment", "another embodiment", "some embodiments", and so forth, means that a particular element (e.g., feature, structure, and/or characteristic) described in connection with the invention is included in at least one embodiment described herein, and may or may not be present in other embodiments. In addition, it is to be understood that the described inventive features may be combined in any suitable manner in the various embodiments and configurations.

Embodiments of the present disclosure will be described hereinbelow with reference to the accompanying drawings. In the following description, well-known functions or constructions are not described in detail to avoid obscuring the disclosure in unnecessary detail. As discussed in detail below, embodiments of the invention includes photovoltaic devices and methods for making them.

The photovoltaic device may be in any configurations depending on the requirements of the application environments. In some embodiments, the photovoltaic device includes a "substrate" configuration. FIG. 1 illustrates an exemplary photovoltaic device 1 according to a first embodiment of the invention. Referring to FIG. 1, the photovoltaic device 1 includes a support layer 2, a first layer 3 comprising cadmium, tellurium and copper and being of n-type, a second layer 4 comprising cadmium, tellurium and copper and being of p-type, and a transparent conductive oxide layer 5.

In such embodiments, the solar radiation (not shown) enters from the transparent conductive oxide layer 5, and after passing through the first layer 3, enters the second layer 4. Conversion of electromagnetic energy of incident light (for instance, sunlight) to electron-hole pairs (that is, to free electrical charge) occurs in both the first layer 3 and the second layer 4.

Figure 2:
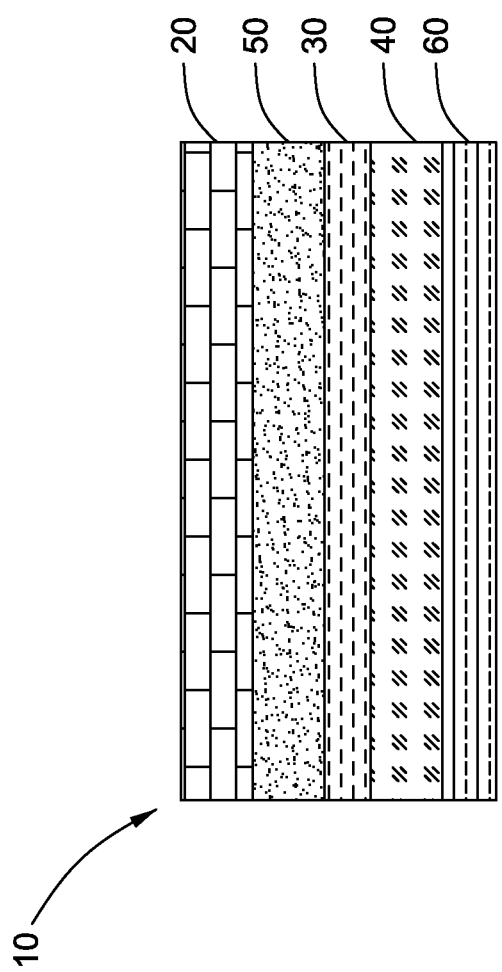
FIG. 2 is a schematic cross-sectional view of a photovoltaic device according to a second embodiment of the invention.

In alternative embodiments, as illustrated in FIG. 2, an exemplary photovoltaic device 10 includes a "superstate" configuration. The photovoltaic device 10 includes a support layer 20, a first layer 30 comprising cadmium, tellurium and copper and being of n-type, a second layer 40 comprising cadmium, tellurium and copper and being of p-type, and a transparent conductive oxide layer 50.

In such embodiments, the solar radiation (not shown) enters from the support layer 20 and after passing through the transparent conductive oxide layer 50 and the first layer 30, enters the second layer 40. Conversion of electromagnetic energy of incident light (for instance, sunlight) to electron-hole pairs (that is, to free electrical charge) occurs in both the first layer 30 and the second layer 40.

As used herein, the term "layer" or "region" refers to a material disposed on at least a portion of an underlying surface in a continuous or discontinuous manner. Further, the term "layer" or "region" does not necessarily mean a uniform thickness of the disposed material, and the disposed material may have a uniform or a variable thickness.

In the present disclosure, when a layer is being described as "on" another layer or "between" other layers, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. The term "adjacent" as used herein means that the two layers are disposed contiguously and are in direct contact with each other.

In some embodiments, the support layer 2, 20 is transparent over the range of wavelengths for which transmission through the support layer 2, 20 is desired. In some embodiments, the support layer 2, 20 includes silica, borosilicate glass, soda-lime glass, polyimide, or any combination thereof.

In some embodiments, the support layer of a photovoltaic device (not shown) includes an electrically conductive material, functions as a back contact layer, and there will be no separate back contact layer. Examples of the electrically conductive material includes, but is not limited to, gold, platinum, molybdenum, tungsten, tantalum, titanium, palladium, aluminum, chromium, nickel, silver, graphite, or any combination thereof.

In some embodiments, certain other layers, such as an anti-reflective layer (not shown), may be disposed on the transparent conductive oxide layer or the support layer on the side where the solar radiation enters.

In some embodiments, certain other layers, such as a barrier layer (not shown), may be disposed on the support layer between the transparent conductive oxide layer and the support layer, or between the back contact layer and the support layer.

The term "transparent conductive oxide layer" as used herein refers to a substantially transparent layer or region capable of functioning as a front current collector. In some embodiments, the transparent conductive oxide layer 5, 50 allows an average transmission of at least 70% of incident electromagnetic radiation having a wavelength in a range from about 350 nm to about 850 nm.

In some embodiments, the transparent conductive oxide layer 5, 50 includes a transparent conductive oxide (TCO). Non-limiting examples of transparent conductive oxides include cadmium tin oxide ($Cd_2SnO_4$ or CTO); indium tin oxide (ITO); fluorine-doped tin oxide (SnO:F or FTO); indium-doped cadmium-oxide; doped zinc oxide (ZnO), such as aluminum-doped zinc-oxide (ZnO:Al or AZO), indium-zinc oxide (IZO), and zinc tin oxide ($ZnSnO_x$ or ZTO); or any combination thereof. Depending on the specific TCO employed and on its sheet resistance, the thickness of the transparent conductive oxide layer 5, 50 may be in a range of from about 50 nm to about 600 nm, in some embodiments.

In some embodiments, the photovoltaic device 1, 10 has a back contact layer 6, 60. In some embodiments, the back contact layer 6, 60 includes gold, platinum, molybdenum, tungsten, tantalum, titanium, palladium, aluminum, chromium, nickel, silver, graphite, or any combination thereof. The back contact layer 6, 60 may include a plurality of layers that function together as the back contact.

In some embodiments, another metal layer (not shown), for example, aluminum, may be disposed on the back contact layer 6, 60 to provide a connection to an outside circuit (not shown). In some embodiments, a plurality of metal layers (not shown), for example, aluminum and chromium, may be disposed on the back contact layer 6, 60 to provide a connection to the outside circuit. In some embodiments, the back contact layer 6, 60 may include a layer of carbon, such as graphite, deposited on the second layer 4, 40, followed by one or more layers of metal, such as the metals described above.

In some embodiments, the photovoltaic device 1, 10 comprises a buffer layer (not shown) between the transparent conductive oxide layer 5, 50 and the first layer 3, 30. The buffer layer has a higher sheet resistance than the sheet resistance of the transparent conductive oxide layer 5, 50. The buffer layer is sometimes referred to as a "high-resistance transparent conductive oxide layer" or "HRT layer". Non-limiting examples of suitable materials for the buffer layer include an oxide of zinc, tin, titanium or indium, such as tin dioxide ($SnO_2$), zinc tin oxide (zinc-stannate (ZTO)), zinc-doped tin oxide ($SnO_2$:Zn), zinc oxide (ZnO), indium oxide ($In_2O_3$), titanium oxide ($TiO_2$) or any combination thereof. In some embodiments, the thickness of the buffer layer is in a range from about 20 nm to about 200 nm.

In some embodiments, the photovoltaic device 1, 10 includes a p+-type semiconducting layer (not shown) disposed between the second layer 4, 40 and the back contact layer 6, 60 and including a p+-type material deposited using any suitable technique, for example plasma enhanced chemical vapor deposition (PECVD) or sputtering. In an alternative embodiment, a p+-type semiconductor region may be formed in the second layer 4, 40 by chemically treating the second layer 4, 40 to increase the carrier density on the back-side (side in contact with the metal layer and opposite to the first layer 3, 30) of the second layer 4, 40 (for example, using iodine and copper). In some embodiments, the back contact layer 6, 60, for example, a graphite layer may be deposited on the p+-type semiconductor layer (embodiment not shown), or directly on the second layer 4, 40. A plurality of metal layers may be further deposited on the back contact layer 6, 60. In some embodiments, a p+-type TCO may be deposited on the back contact layer and the second layer may be adjacent the p+-type TCO layer.

The term "p+-type semiconductor layer" as used herein refers to a semiconductor layer having an excess mobile p-type charge carrier or hole density compared to the p-type charge carrier or hole density in the second layer 4, 40. In some embodiments, the p+-type semiconductor layer has a p-type charge carrier density in a range greater than about $1 \times 10^{16}$ per cubic centimeter. The p+-type semiconductor layer may be used as an interface between the second layer 4, 40 and the back contact layer 6, 60, in some embodiments.

In some embodiments, the p+-type semiconductor layer includes a heavily doped p-type material including amorphous Si:H, amorphous SiC:H, crystalline Si, microcrystalline Si:H, microcrystalline SiGe:H, amorphous SiGe:H, amorphous Ge, microcrystalline Ge, GaAs, BaCuSF, BaCuSeF, BaCuTeF, LaCuOS, LaCuOSe, LaCuOTe, LaSrCuOS, LaCuOSe$_{0.6}$Te$_{0.4}$, BiCuOSe, BiCaCuOSe, PrCuOSe, NdCuOS, Sr$_2$Cu$_2$ZnO$_2$S$_2$, Sr$_2$CuGaO$_3$S, (Zn,Co,Ni)O$_x$, or any combination thereof. In another embodiment, the p+-type semiconductor layer includes a p+-doped material including zinc telluride, magnesium telluride, manganese telluride, beryllium telluride, mercury telluride, arsenic telluride, antimony telluride, copper telluride, or any combination thereof. In some embodiments, the p+-doped material further includes a dopant including copper, gold, nitrogen, phosphorus, antimony, arsenic, silver, bismuth, sulfur, sodium, or any combination thereof.

As understood by a person skilled in the art, the sequence of disposing the layers of the photovoltaic devices may depend on a desirable configuration, for example, "substrate" or "superstrate" configuration of the photovoltaic device. In some embodiments, the photovoltaic device 1, 10 may be made by a method comprising: providing a stack (not shown) comprising a cadmium and tellurium comprising layer (not shown) and a copper comprising layer (not shown) on the cadmium and telluride tellurium comprising layer, and thermally annealing the stack to form a first layer 3, 30 and a second layer 4, 40 each comprising cadmium, tellurium and copper, the first layer 3, 30 being of n-type, the second layer 4, 40 being of p-type.

In some embodiments, the stack comprises a support layer 2 and a back contact layer 6 disposed on the support layer 2. The cadmium and tellurium comprising layer is disposed on the back contact layer 6.

As used herein, the term "disposed on" refers to layers disposed directly in contact with each other or indirectly by having intervening layers there between, unless otherwise specifically indicated.

In some embodiments, the transparent conductive oxide layer 5 is disposed on the first layer 3 after thermally annealing the stack by any suitable technique, such as sputtering, chemical vapor deposition, spin coating, spray coating, or dip coating.

In some embodiments, the transparent conductive oxide layer 50 is disposed on the support layer 20 by any suitable technique, such as sputtering, chemical vapor deposition, spin coating, spray coating, or dip coating.

In some embodiments, a buffer layer (not shown) may be deposited on the transparent conductive oxide layer 5, 50, using sputtering.

In some embodiments, a CdTe layer is disposed on the transparent conductive oxide layer.

Non-limiting examples of the deposition methods for the cadmium and tellurium comprising layer include one or more of close-space sublimation (CSS), vapor transport deposition (VTD), sputtering (for example, direct current pulse sputtering (DCP), electro-chemical deposition (ECD), ion-assisted physical vapor deposition (IAPVD), radio frequency or pulsed magnetron sputtering (RFS or PMS), PECVD, and chemical bath deposition (CBD).

In some embodiments, the copper comprising layer comprises metallic copper, CuS, CuSe, ZnTe:Cu, or any combination thereof. The copper comprising layer may be deposited using suitable methods or formed by soaking the stack in a copper comprising solution. In some embodiments, the copper comprising solution comprises copper acetate or copper chloride.

In some embodiments, the cadmium and tellurium comprising layer is deposited directly on the copper comprising layer. In some embodiments, the copper comprising layer is deposited directly on the cadmium and tellurium comprising layer.

After thermally annealing the stack, the cadmium and tellurium comprising layer and the copper comprising layer are formed into a first layer 3, 30 and a second layer 4, 40 each comprising cadmium, tellurium and copper. In some embodiments, the cadmium and tellurium comprising layer includes a first region and a second region. The second region may be different from or the same as the first region in configuration or composition. After thermally annealing the stack, copper diffuses into the first region and the second region, the first region is formed into the first layer 3, 30 of n-type and the second region is formed into the second layer 4, 40 of p-type.

In some embodiments, the deposition of the cadmium and tellurium comprising layer and the thermally annealing of the cadmium and tellurium comprising layer and the copper comprising layer may be achieved in the same step as long as the conditions such as the temperature and the time are appropriate for both actions.

In some embodiments, the thermally annealing is at a temperature of about 250° C. in a time period of greater than about 12 minutes and less than about 30 minutes.

The cadmium and tellurium comprising layer comprises cadmium, tellurium, and in some embodiments, zinc, selenium, mercury, lead, sulfur or any combination thereof.

In some embodiments, the first layer or the second layer comprises zinc, selenium, mercury, lead, sulfur or any combination thereof. A total atomic percentage of zinc, selenium, mercury, lead, sulfur or any combination thereof in the first layer or the second layer is up to about 10%.

The concentration of cadmium, tellurium, copper and, optionally, zinc, selenium, mercury, lead, sulfur or any combination thereof within the first layer 3, 30 or the second layer 4, 40 may be substantially constant or compositionally graded across different directions of the layer(s).

In some embodiments, a series of post-forming treatments may be further applied to the exposed surface of the first layer 3 or the second layer 40. These treatments may tailor the functionality of the first layer 3 or the second layer 40 and prepare its surface for subsequent adhesion to the transparent conductive oxide layer 5, the back contact layer 60 or other layer. For example, the second layer 40 may be annealed at elevated temperatures for a sufficient time to create a quality p-type layer. Further, the second layer 40 may be treated with a passivating agent (e.g., cadmium chloride) and a tellurium-enriching agent (for example, iodine or an iodide) to form a tellurium-rich region in the second layer 40.

In some embodiments, a layer is formed to passivate the surface of the first layer. Exemplary materials used in the passivating layer include, but are not limited to CdMnTe or CdMgTe.

One or more of the first layer 3, the second layer 40, the back contact layer 6, 60, or the p+-type layer (optional) may be further heated or subsequently treated (for example, annealed) after formation to make the photovoltaic device 1, 10.

The photovoltaic device may achieve a reduction in cost because of the elimination of a CdS layer. In addition, absorption losses in the CdS layer are eliminated, so the efficiency of the photovoltaic device is increased.

EXAMPLES

The following examples are included to provide an additional guidance to those of ordinary skill in the art in practicing the claimed invention. These examples do not limit the invention as defined in the appended claims.

Comparative Example 1

A photovoltaic device was made by depositing several layers on a support layer. The support layer was a 1.4 millimeters thick PVN++ glass, which was coated with a cadmium tin oxide (CTO) transparent conductive oxide layer and a thin high resistance transparent zinc tin oxide (ZTO) buffer layer. Cadmium sulfide layer (CdS:O, 5 molar % oxygen in the CdS layer) was deposited on the ZTO buffer layer by DC sputtering followed by deposition of cadmium telluride (CdTe) layer at 550° C. to provide a stack. A layer of gold was then deposited on the CdTe layer of the stack as a back-contact layer of the photovoltaic device.

Comparative Example 2

A photovoltaic device was made using a method similar to that of Comparative Example 1, except the CdTe layer of the stack was subject to a "$CdCl_2$ treatment" process, in which it was exposed to $CdCl_2$ and air during high temperature annealing at 400° C., before the formation of the back-contact layer.

Comparative Example 3

Four photovoltaic devices were made using a method similar to that of Comparative Example 2, except four stacks each comprising the support layer, the transparent conductive oxide layer, the buffer layer, the cadmium sulfide layer and the cadmium telluride layer, after the $CdCl_2$ treatment, were soaked in a copper acetate solution and were thermally annealed for 12 minutes at 170° C., 210° C. or 250° C., or for 30 minutes at 250° C. respectively, before the formation of the back contact layers.

Example 1

A photovoltaic device was made using a method similar to that of Comparative Example 3, except during thermally annealing the stack, the temperature was 250° C. and the time was 18 minutes.

Example 2

Figure 3:
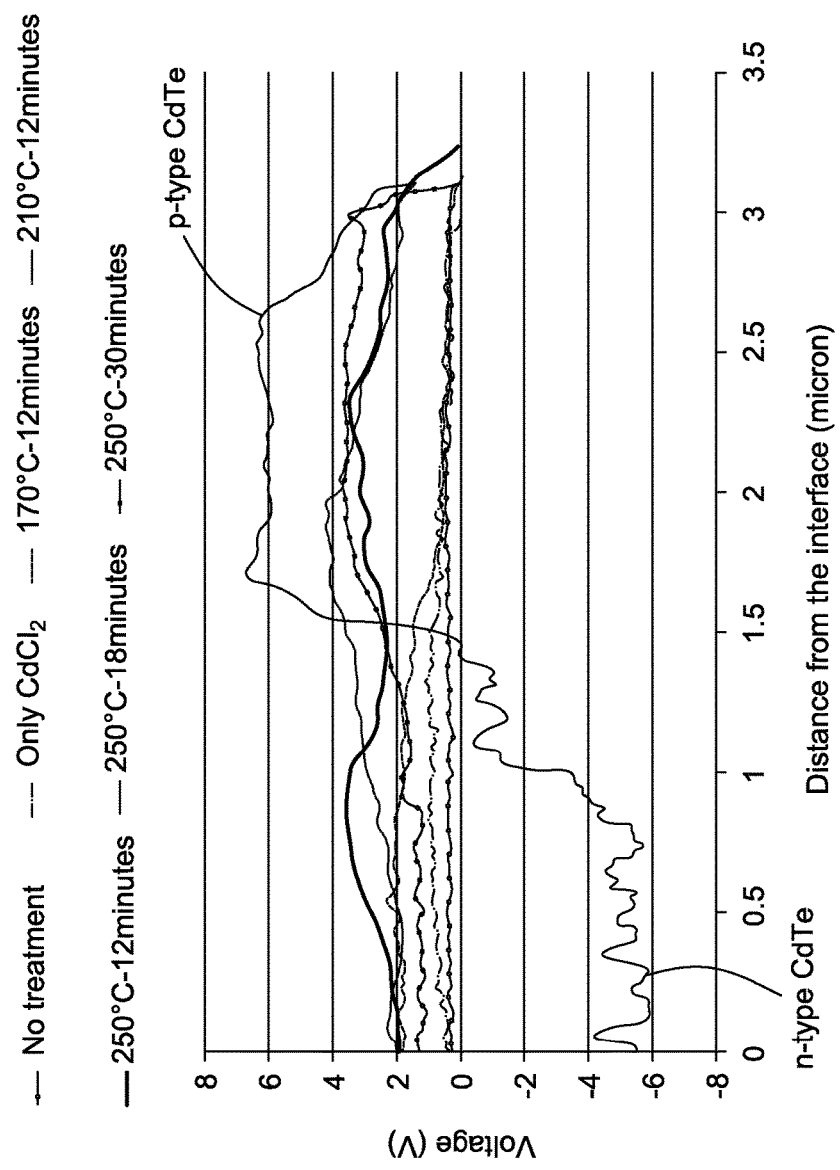
FIG. 3 illustrates voltages of samples of the photovoltaic devices made in comparative examples 1-3 and example 1 at locations with different distances from the interfaces between the cadmium telluride layers and the back contact layers.

Scanning Capacitance Microscopy (SCM) line scan of samples of the photovoltaic devices made in comparative examples 1-3 and example 1 were performed. FIG. 3 shows the voltages at locations with different distances from the interfaces between the cadmium telluride layers and the back-contact layers.

FIG. 3 shows that the $CdCl_2$ treatment did not affect the charge carrier density, p-type cadmium telluride was formed in the sample thermally annealed at 170° C. for 12 minutes at locations close to the interface, and copper spread more uniformly across the cadmium telluride layers of the samples thermally annealed at 210° C. and 250° C. for 12 minutes. Both n-type cadmium telluride layer and p-type cadmium telluride layer were formed in the sample thermally annealed at 250° C. for 18 minutes, at regions near and far from the interface between the cadmium telluride layer and the back contact layer, respectively.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

The invention claimed is:

1. A photovoltaic device, comprising:
    a support layer;
    a cadmium and tellurium layer comprising cadmium and tellurium, and being of p-type; and
    a transparent conductive oxide layer;
    wherein the photovoltaic device is free of a CdS layer,
    wherein the cadmium and tellurium layer comprises zinc, selenium, mercury, lead, or any combination thereof,
    wherein a concentration of the zinc, selenium, mercury, lead, or any combination thereof within the cadmium and tellurium layer is compositionally graded, and
    wherein a total atomic percentage of the zinc, selenium, mercury, lead, or any combination thereof of the cadmium and tellurium layer is up to about 10 atomic %.

2. The photovoltaic device of claim 1, wherein the support layer is a back contact layer.

3. The photovoltaic device of claim 1, comprising a buffer layer comprising an oxide of zinc, tin, titanium, or indium.

4. The photovoltaic device of claim 1, wherein the transparent conductive oxide layer comprises a transparent conductive oxide selected from the group consisting of cadmium tin oxide ($Cd_2SnO_4$), indium tin oxide (ITO), fluorine-doped tin oxide (SnO:F), indium-doped cadmium-oxide, doped zinc oxide (ZnO), indium-zinc oxide (IZO), zinc tin oxide (ZTO), and combinations thereof.

5. The photovoltaic device of claim 1, wherein:
    the cadmium and tellurium layer comprises zinc, and
    a concentration of the zinc within the cadmium and tellurium layer is compositionally graded.

6. The photovoltaic device of claim 1, wherein:
    the cadmium and tellurium layer comprises selenium, and
    a concentration of the selenium within the cadmium and tellurium layer is compositionally graded.

7. The photovoltaic device of claim 1, wherein:
    the cadmium and tellurium layer comprises mercury, and
    a concentration of the mercury within the cadmium and tellurium layer is compositionally graded.

8. The photovoltaic device of claim 1, wherein:
    the cadmium and tellurium layer comprises lead, and
    a concentration of the lead within the cadmium and tellurium layer is compositionally graded.

9. A photovoltaic device, comprising:
    a support layer;
    a transparent conductive oxide layer directly on the support layer;
    a first layer comprising cadmium, tellurium, and copper, and being of n-type, in direct contact with the transparent conductive oxide layer; and
    a second layer comprising cadmium, tellurium, and copper, and being of p-type;
    wherein the photovoltaic device is free of a CdS layer.

10. The photovoltaic device of claim 9, comprising a back contact layer.

11. The photovoltaic device of claim 10, wherein the first layer is between the transparent conductive oxide layer and the second layer, and the second layer is between the first layer and the back contact layer.

12. The photovoltaic device of claim 10, wherein the transparent conductive oxide layer is between the first layer and the support layer, and the second layer is between the first layer and the back contact layer.

* * * * *